(12) United States Patent
Akebono et al.

(10) Patent No.: US 9,811,062 B2
(45) Date of Patent: Nov. 7, 2017

(54) POWER SUPPLY SWITCHING CIRCUIT, ELECTRONIC DEVICE, AND CONTROL METHOD OF POWER SUPPLY SWITCHING CIRCUIT

(71) Applicant: Sony Corporation, Tokyo (JP)

(72) Inventors: Sachio Akebono, Kanagawa (JP); Kiyoshi Makigawa, Kanagawa (JP); Daisuke Hirono, Kanagawa (JP); Moonjae Jeong, Kanagawa (JP); Taiki Iguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 418 days.

(21) Appl. No.: 14/301,137

(22) Filed: Jun. 10, 2014

(65) Prior Publication Data

US 2015/0005976 A1    Jan. 1, 2015

(30) Foreign Application Priority Data

Jun. 28, 2013    (JP) .................................. 2013-136138

(51) Int. Cl.
*G05B 15/02*    (2006.01)

(52) U.S. Cl.
CPC .................................. *G05B 15/02* (2013.01)

(58) Field of Classification Search
CPC ... H02J 9/062; Y10T 307/625; Y10T 307/735
USPC .... 307/64–66, 23, 28, 87; 363/21.02, 21.08, 363/21.12, 49, 97; 320/20, 32, 37
See application file for complete search history.

(56) References Cited

U.S. PATENT DOCUMENTS

| 5,608,273 | A   | * | 3/1997  | Bartlett ................... | H02J 9/061 307/64   |
| 6,504,270 | B1  | * | 1/2003  | Matsushita .............   | H02J 9/061 307/125  |
| 7,282,899 | B1  | * | 10/2007 | Daun-Lindberg ........    | H02J 1/10 323/272   |
| 7,471,121 | B2  | * | 12/2008 | Yang .......................    | H02M 1/08 326/87    |
| 7,960,861 | B2  | * | 6/2011  | Gscheidle ...............  | H02J 1/108 307/43   |
| 8,242,637 | B2  | * | 8/2012  | Chen ........................    | H02J 9/06 307/85    |

(Continued)

FOREIGN PATENT DOCUMENTS

JP    2006-254672    9/2006

*Primary Examiner* — Rajnikant Patel
(74) *Attorney, Agent, or Firm* — Michael Best & Friedrich LLP

(57) ABSTRACT

There is provided a power supply switching circuit including a first control signal output unit that outputs a signal exceeding a predetermined potential using a main power supply as a first control signal when a power supply voltage of the main power supply exceeds a predetermined reference voltage, a second control signal output unit that outputs the signal exceeding the predetermined potential using a standby power supply from a battery as a second control signal when a potential of the first control signal does not exceed the predetermined potential, and a power supply output unit that outputs the main power supply when the first control signal exceeds the predetermined potential and outputs the standby power supply when the second control signal exceeds the predetermined potential.

18 Claims, 15 Drawing Sheets

(56) References Cited

U.S. PATENT DOCUMENTS

| | | | |
|---|---|---|---|
| 8,330,294 B2 * | 12/2012 | Nishigata | G06F 1/263 |
| | | | 307/130 |
| 8,858,885 B2 * | 10/2014 | Raynor | B01J 19/0046 |
| | | | 156/242 |
| 8,937,403 B2 * | 1/2015 | Scaldaferri | H02J 1/10 |
| | | | 307/52 |
| 9,385,530 B2 * | 7/2016 | Lee | H02J 1/10 |

* cited by examiner a b a b a b

POWER SUPPLY SWITCHING CIRCUIT, ELECTRONIC DEVICE, AND CONTROL METHOD OF POWER SUPPLY SWITCHING CIRCUIT

CROSS REFERENCE TO RELATED APPLICATIONS

This application claims the benefit of Japanese Priority Patent Application JP 2013-136138 filed Jun. 28, 2013, the entire contents of which are incorporated herein by reference.

BACKGROUND

The present technology relates to a power supply switching circuit, an electronic device, and a control method of the power supply switching circuit. In particular, the present technology relates to a power supply switching circuit that switches between a main power supply and a power supply from a battery, an electronic device, and a control method of the power supply switching circuit.

A battery backup system has been used in electronic devices such as computers so that data is not lost even if the supply from the main power supply is stopped. In the battery backup system, a standby power supply from a battery is supplied to a storage apparatus when the supply from the main power supply is stopped so that necessary data is stored in the storage apparatus.

To realize the battery backup system, a power supply switching circuit including a comparator, an inverter, and two transistors is proposed (see, for example, JP 2006-254672A). In the power supply switching circuit, the comparator compares the voltage of the main power supply and the voltage of a battery and the inverter inverts the comparison result. Then, one of the two transistors outputs or shuts off the main power supply based on the comparison result and the other transistor outputs or shuts off the standby power supply based on the inverted comparison result. Accordingly, power of one of the AC power supply and the battery having a higher voltage is supplied to a load.

SUMMARY

However, according to the above-described technology in the past, it is difficult to reduce power consumption of the battery before starting the backup. In the above power supply switching circuit, it is necessary to supply power from both of the AC power supply and the battery. Thus, when electric power from the battery is not supplied, there is the possibility that electric power of the battery is supplied to the comparator so that the battery is exhausted. In addition, even if the AC power supply of the voltage higher than the lowest operating voltage of a load is supplied, if the voltage of the AC power supply is lower than the voltage of the battery, there is the possibility that electric power of the battery is supplied so that the battery is exhausted.

The present technology is created in view of the above situation and it is desirable to reduce power consumption of a battery in a power supply switching circuit.

According to an embodiment of the present technology, there is provided a power supply switching circuit including a first control signal output unit that outputs a signal exceeding a predetermined potential using a main power supply as a first control signal when a power supply voltage of the main power supply exceeds a predetermined reference voltage, a second control signal output unit that outputs the signal exceeding the predetermined potential using a standby power supply from a battery as a second control signal when a potential of the first control signal does not exceed the predetermined potential, and a power supply output unit that outputs the main power supply when the first control signal exceeds the predetermined potential and outputs the standby power supply when the second control signal exceeds the predetermined potential. Accordingly, an operation of the main power supply being output when the first control signal exceeds the predetermined potential and the standby power supply being output when the second control signal exceeds the predetermined potential is achieved.

Further, according to an embodiment of the present technology, the power supply output unit may include a main power supply side output unit that outputs or shuts off the main power supply depending on whether the potential of a main power supply side control signal, which is one of the first and second control signals, exceeds the predetermined potential, and a standby power supply side output unit that outputs or shuts off the standby power supply depending on whether the potential of a standby power supply side control signal, which is the other of the first and second control signals, exceeds the predetermined potential. Accordingly, an operation of the main power supply being output or shut off depending on whether the potential of the main power supply side control signal exceeds the predetermined potential and the standby power supply being output or shut off depending on whether the potential of the standby power supply side control signal exceeds the predetermined potential is achieved.

Further, according to an embodiment of the present technology, the standby power supply side output unit may include a standby power supply side control transistor that outputs or shuts off the standby power supply depending on whether the potential of the standby power supply side control signal exceeds the predetermined potential after a first standby power supply side parasitic diode being formed, and a standby power supply side rectifier transistor in which a second standby power supply side parasitic diode that suppresses a current in a direction opposite to the direction in which the first standby power supply side parasitic diode suppresses the current is formed. Accordingly, an operation of the current in a direction opposite to the direction in which the first standby power supply side parasitic diode suppresses the current being suppressed is achieved.

Further, according to an embodiment of the present technology, the main power supply side output unit may include a main power supply side control transistor that outputs or shuts off the main power supply depending on whether the potential of the main power supply side control signal exceeds the predetermined potential after a first main power supply side parasitic diode being formed, and a main power supply side rectifier transistor in which a second main power supply side parasitic diode that suppresses a current in a direction opposite to the direction in which the first main power supply side parasitic diode suppresses the current is formed. Accordingly, an operation of the current in a direction opposite to the direction in which the first main power supply side parasitic diode suppresses the current being suppressed is achieved.

Further, according to an embodiment of the present technology, the power supply switching circuit may further include a delay unit that delays one of the first and second control signals with respect to the other. Accordingly, an operation of one of the detection signal and the inverted signal being delayed with respect to the other is achieved.

Further, according to an embodiment of the present technology, the first control signal output unit may output a signal not exceeding the predetermined potential as the first control signal when the power supply voltage does not exceed the predetermined potential. The second control signal output unit may output the signal not exceeding the predetermined potential as the second control signal when the potential of the first control signal exceeds the predetermined potential. Accordingly, an operation of the signal that does not exceed the predetermined potential being output as the first control signal when the power supply voltage does not exceed the reference voltage and the signal that does not exceed the predetermined potential being output as the second control signal when the potential of the first control signal exceeds the predetermined potential is achieved.

Further, according to an embodiment of the present technology, there is provided a power supply switching circuit including a voltage detector that outputs a detection signal by using a main power supply to detect the main power supply, an inverter that inverts the detection signal output by the voltage detector by using a standby power supply from a battery and outputs the signal as an inverted signal, a main power supply side control transistor that outputs or shuts off the main power supply based on one of the detection signal and the inverted signal, and a standby power supply side control transistor that outputs or shuts off the standby power supply based on the other of the detection signal and the inverted signal. Accordingly, an operation of the main power supply being output or shut off based on one of the detection signal and the inverted signal and the standby power supply being output or shut off based on the other of the detection signal and the inverted signal is achieved.

Further, according to an embodiment of the present technology, there is provided an electronic device including a main power supply unit that supplies a main power supply, a battery that supplies a standby power supply, a first control signal output unit that outputs a signal exceeding a predetermined potential using the main power supply as a first control signal when a power supply voltage of the main power supply exceeds a predetermined reference voltage, a second control signal output unit that outputs the signal exceeding the predetermined potential using the standby power supply as a second control signal when a potential of the first control signal does not exceed the predetermined potential, and a power supply output unit that outputs the main power supply when the first control signal exceeds the predetermined potential and outputs the standby power supply when the second control signal exceeds the predetermined potential. Accordingly, an operation of the main power supply being output when the first control signal exceeds the predetermined potential and the standby power supply being output when the second control signal exceeds the predetermined potential is achieved.

According to the present technology, an excellent effect of being able to reduce power consumption of a battery in a power supply switching circuit can be achieved.

DETAILED DESCRIPTION OF THE EMBODIMENTS

Figure 1:
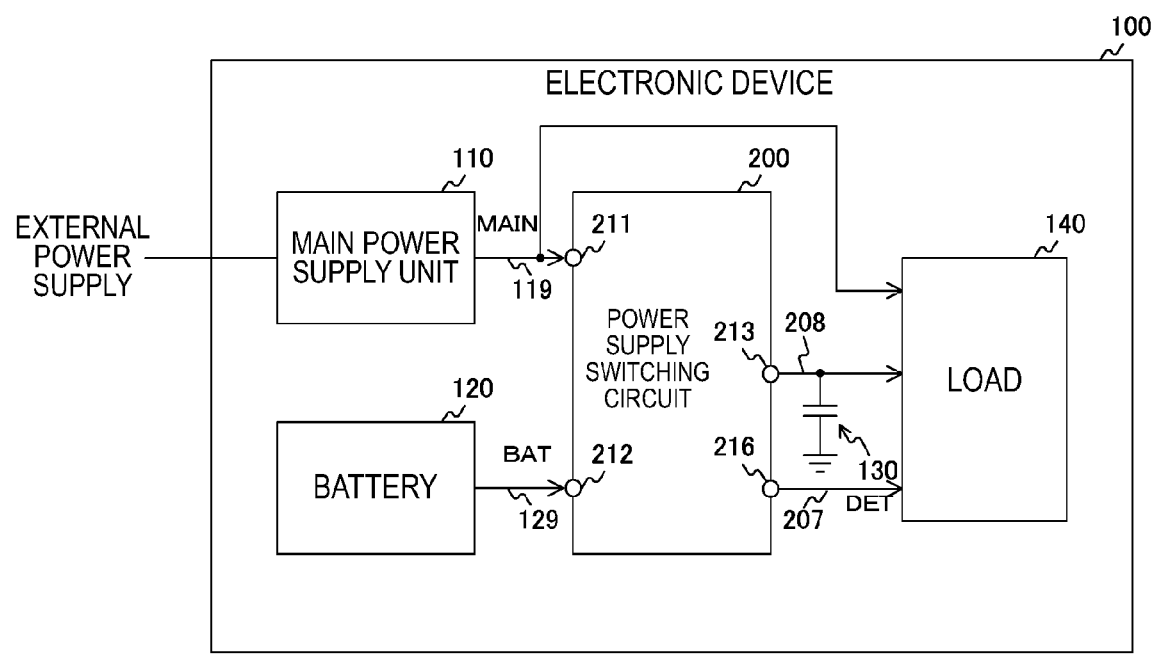
FIG. 1 is a block diagram showing a configuration example of an electronic device according to a first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Forms (hereinafter, called embodiments) to carry out the present technology will be described below. The description will be provided in the order shown below:

1. First embodiment (example of switching the power supply by detecting the main power supply)

2. Second embodiment (example of switching the power supply by providing a standby power supply side rectifier transistor)

3. Third embodiment (example of switching the power supply by providing a main power supply side rectifier transistor)

4. Fourth embodiment (example of switching the power supply by providing a main power supply side rectifier transistor and a standby power supply side rectifier transistor)

5. Fifth embodiment (example of switching the power supply by delaying a detection signal)

6. Sixth embodiment (example of switching the power supply by delaying a detection signal through an RC circuit)

1. First Embodiment

[Configuration Example of the Electronic Device]

FIG. 1 is a block diagram showing a configuration example of an electronic device 100 according to the first embodiment. The electronic device 100 includes a main power supply unit 110, a battery 120, a power supply switching circuit 200, a capacitor 130, and a load 140.

The main power supply unit 110 supplies a main power supply. For example, the main power supply unit 110 receives an external power supply of AC, converts the external power supply into DC, and supplies the power supply of DC to the power supply switching circuit 200 and the load 140 via a signal line 119 as a main power supply MAIN.

The battery 120 stores or discharges electric power. As the battery 120, for example, a button-type primary battery can be used. Also, a secondary battery such as a lithium battery may also be used as the battery 120. The battery 120 supplies stored electric power to the power supply switching circuit 200 via a signal line 129 as a standby power supply BAT.

The power supply switching circuit 200 switches the supply source of the power supply to the load 140. The power supply switching circuit 200 detects whether a power supply voltage VDD of the main power supply MAIN is higher than a constant reference voltage Vref and outputs a detection signal DET to the load 140 via a signal line 207. Then, when the power supply voltage VDD is higher than the reference voltage Vref, the power supply switching circuit 200 supplies the main power supply to the load 140 via a signal line 208 and otherwise, supplies the standby power supply BAT from the battery to the load 140 via the signal line 208.

The capacitor 130 holds the voltage supplied from the power supply switching circuit 200. One end of the capacitor 130 is connected to an output terminal of the power supply switching circuit 200 and an input terminal of the load 140 and a ground potential VSS is applied to the other end. A rapid drop in voltage during power supply switching is suppressed by the capacitor 130. The load 140 consumes the main power supply MAIN or the standby power supply BAT.

[Configuration Example of the Power Supply Switching Circuit]

Figure 2:
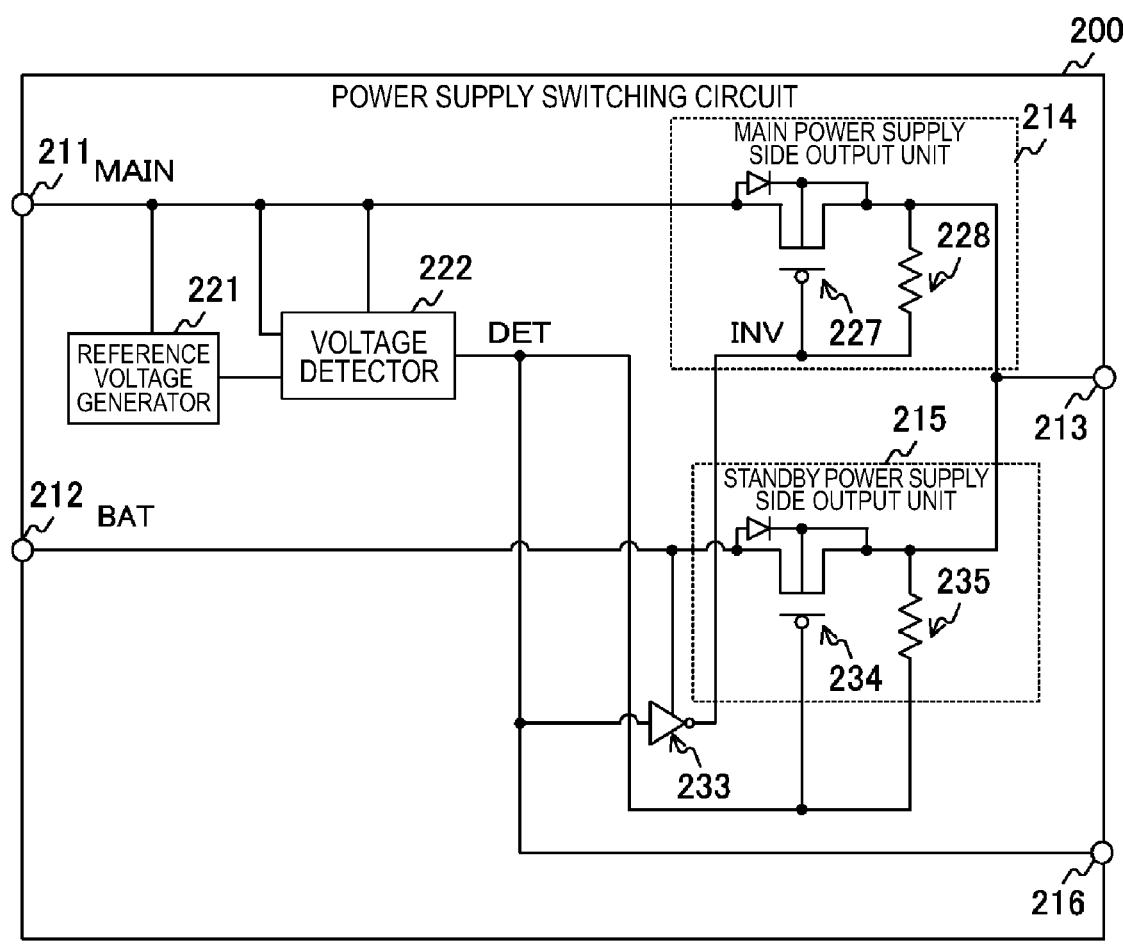
FIG. 2 is a block diagram showing a configuration example of a power supply switching circuit according to the first embodiment.

FIG. 2 is a block diagram showing a configuration example of the power supply switching circuit 200 according to the first embodiment. The power supply switching circuit 200 includes a main power supply side input terminal 211, a standby power supply side input terminal 212, a power supply output terminal 213, a detection signal output terminal 216, a reference voltage generator 221, a voltage detector 222, an inverter 233, a main power supply side output unit 214, and a standby power supply side output unit 215.

The main power supply side input terminal 211 is a terminal connected to the main power supply unit 110. The standby power supply side input terminal 212 is a terminal connected to the battery 120. The power supply output terminal 213 is a terminal connected to the load 140 to output a power supply to the load 140. The detection signal output terminal 216 is a terminal connected to the load 140 to output the detection signal DET to the load 140.

The reference voltage generator 221 generates the constant reference voltage Vref from the main power supply MAIN. The reference voltage generator 221 includes, for example, a band gap reference circuit or a regulator and generates the constant reference voltage Vref by using such a circuit or a device. The reference voltage generator 221 supplies the generated reference voltage Vref to the voltage detector 222.

The voltage detector 222 detects whether the power supply voltage VDD of the main power supply MAIN is higher than the reference voltage Vref. The voltage detector 222 uses, for example, a comparator to compare the power supply voltage VDD and the reference voltage Vref. When the power supply voltage VDD exceeds the reference voltage Vref, the voltage detector 222 uses the main power supply MAIN to output a signal of a potential (high level) higher than a predetermined potential to the inverter 233 and the standby power supply side output unit 215 as the detection signal DET. On the other hand, when the power supply voltage VDD is equal to the reference voltage Vref or lower, the voltage detector 222 outputs a signal whose potential is equal to the predetermined potential or lower (low level) to the inverter 233, the power supply output terminal 216, and the standby power supply side output unit 215 as the detection signal DET.

The detection signal DET is an example of a first control signal and the voltage detector 222 is an example of a first control signal output unit. The voltage detector 222 compares the power supply voltage VDD with the reference voltage Vref without dividing the power supply voltage VDD, but may divide the power supply voltage VDD to compare the divided voltage with the reference voltage Vref. In this case, if the division ratio is n:1 (n is a real number), the detection signal DET shows a result of comparing the voltage of n X Vref and the power supply voltage VDD.

The inverter 233 inverts the detection signal DET. The inverter 233 is realized by, for example, a p-type MOS (Metal-Oxide-Semiconductor) transistor and an n-type MOS transistor connected in series to the standby power supply BAT. When the detection signal DET is a low level, the inverter 233 uses the standby power supply BAT to output a high-level signal to the main power supply side output unit 214 as an inverted signal INV. When the detection signal DET is a high level, on the other hand, the inverter 233 outputs a low-level signal to the main power supply side output unit 214 as an inverted signal INV. The inverted signal INV is an example of a second control signal and the inverter 233 is an example of a second control signal output unit.

The main power supply side output unit 214 outputs or shuts off the main power supply MAIN depending on whether or not the inverted signal INV is a high level. The main power supply side output unit 214 includes a main power supply side control transistor 227 and a resistor 228.

As the main power supply side control transistor 227, for example, a p-type MOS transistor is used. The drain of the main power supply side control transistor 227 is connected to the main power supply side input terminal 211, the source thereof is connected to the power supply output terminal 213, and the inverted signal INV is input into the gate thereof.

With the above configuration, the main power supply side control transistor 227 shifts to an on state to output the main power supply MAIN when the inverted signal INV is a low level and shifts to an off state to shut off the main power supply MAIN when the inverted signal INV is a high level.

One end of the resistor 228 is connected to the source of the main power supply side control transistor 227 and the other end thereof is connected to the gate of the main power supply side control transistor 227. With the above configuration, even if the potential (such as the ground potential VSS) of a low-level inverted signal INV is relatively high, the main power supply side control transistor 227 reliably shifts to an on state due to a voltage drop between the source and gate by the resistor 228. Also if the power supply of the inverted signal INV is not sufficient and the output thereof is high impedance, the main power supply side control transistor 227 reliably shifts to an on state due to the voltage drop. The resistor 228 is connected to the output side of the inverter 233 and thus, no current from the standby power supply BAT flows to the resistor 228 and power consumption of the battery 120 is curbed.

The standby power supply side output unit 215 outputs or shuts off the standby power supply BAT depending on whether or not the detection signal DET is a high level. The standby power supply side output unit 215 includes a standby power supply side control transistor 234 and a resistor 235.

As the standby power supply side control transistor 234, for example, a p-type MOS transistor is used. The drain of the standby power supply side control transistor 234 is connected to the standby power supply side input terminal 212, the source thereof is connected to the power supply output terminal 213, and the detection signal DET is input into the gate thereof.

With the above configuration, the standby power supply side control transistor 234 shifts to an on state to output the standby power supply BAT when the detection signal DET is a low level and shifts to an off state to shut off the standby power supply BAT when the detection signal DET is a high level. A circuit including the main power supply side output unit 214 and the standby power supply side output unit 215 is an example of a power supply output unit described in claims.

One end of the resistor 235 is connected to the source of the standby power supply side control transistor 234 and the other end thereof is connected to the gate of the standby power supply side control transistor 234. With the above configuration, even if the potential (such as the ground potential VSS) of a low-level detection signal DET is relatively high, the standby power supply side control transistor 234 reliably shifts to an on state due to a voltage drop between the source and gate by the resistor 235. Also if the power supply of the voltage detector 222 is not sufficient and the output thereof is high impedance, the standby power supply side control transistor 234 reliably shifts to an on state due to the voltage drop.

[Configuration Example of the Load]

Figure 3:
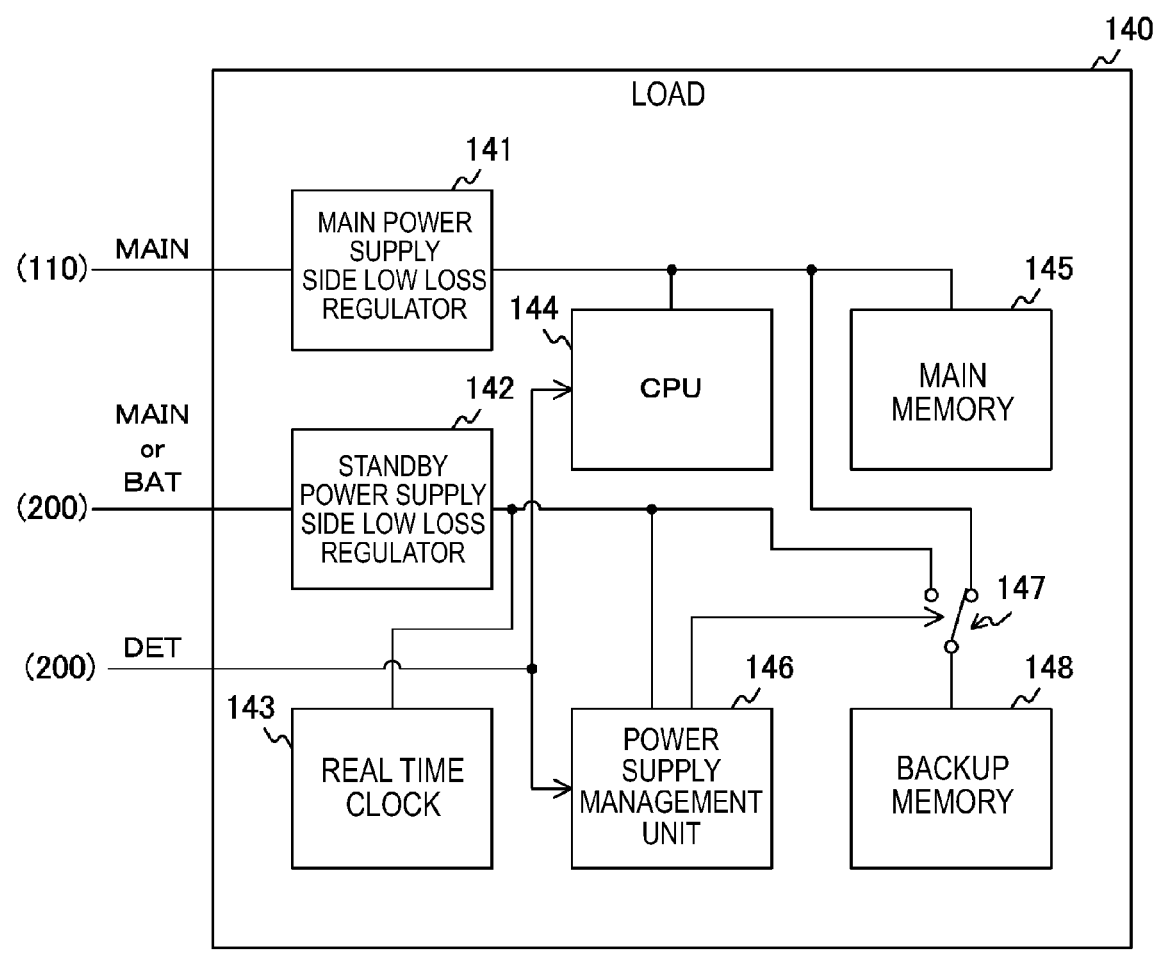
FIG. 3 is a block diagram showing a configuration example of a load according to the first embodiment.

FIG. 3 is a block diagram showing a configuration example of the load 140 according to the first embodiment. The load 140 includes a main power supply side low loss regulator 141, a CPU (Central Processing Unit) 144, and a main memory 145. The load 140 also includes a standby power supply side low loss regulator 142, a real time clock 143, a power supply management unit 146, a power supply changeover switch 147, and a backup memory 148.

The main power supply side low loss regulator 141 controls the output voltage to a constant level based on the main power supply MAIN from the main power supply unit 110. The main power supply side low loss regulator 141 generates a constant output voltage from the main power supply MAIN and supplies the output voltage to the CPU 144, the main memory 145, and the power supply changeover switch 147.

The CPU 144 controls the whole load 140. The CPU 144 receives the detection signal DET from the power supply switching circuit 200. When the power supply voltage VDD is equal to the reference voltage Vref or lower, the CPU 144 performs predetermined processing such as backup processing of data and reset processing. In the backup processing, the CPU 144 causes the backup memory 148 to store data to be backed up.

The main memory 145 is used as a work area to temporarily store programs executed by the CPU 144 and data necessary for processing. The area to store programs may be configured by a flash ROM (Read Only Memory) and the area to primarily store data necessary for processing may be configured by a RAM (Random Access Memory).

The standby power supply side low loss regulator 142 controls the output voltage to a constant level based on the main power supply MAIN or the standby power supply BAT from the power supply switching circuit 200. The standby power supply side low loss regulator 142 generates a constant output voltage from the main power supply MAIN or the standby power supply BAT and supplies the output voltage to the real time clock 143, the power supply management unit 146, and the power supply changeover switch 147.

The real time clock 143 is driven when the main power supply MAIN or the standby power supply BAT is supplied to generate current time data showing the current time.

The power supply management unit 146 controls the supply voltage to a device inside the load 140. The power supply management unit 146 receives the detection signal DET from the power supply switching circuit 200. When the power supply voltage VDD is equal to the reference voltage Vref or lower, the power supply management unit 146 controls the power supply changeover switch 147 to switch the supply source of the power supply to the backup memory 148 from the main power supply MAIN to the standby power supply BAT.

The power supply changeover switch 147 switches the supply source of the power supply. The power supply changeover switch 147 includes two input terminals and one output terminal. One of the two input terminals is connected to the main power supply side low loss regulator 141 and the other thereof is connected to the standby power supply side low loss regulator 142. The output terminal of the power supply changeover switch 147 is connected to the backup memory 148. The output terminal of the power supply changeover switch 147 switches the supply source of the power supply to the backup memory 148 according to the control of the power supply management unit 146.

The backup memory 148 stores data to be backed up.

[Operation Example of the Electronic Circuit]

Figure 4:
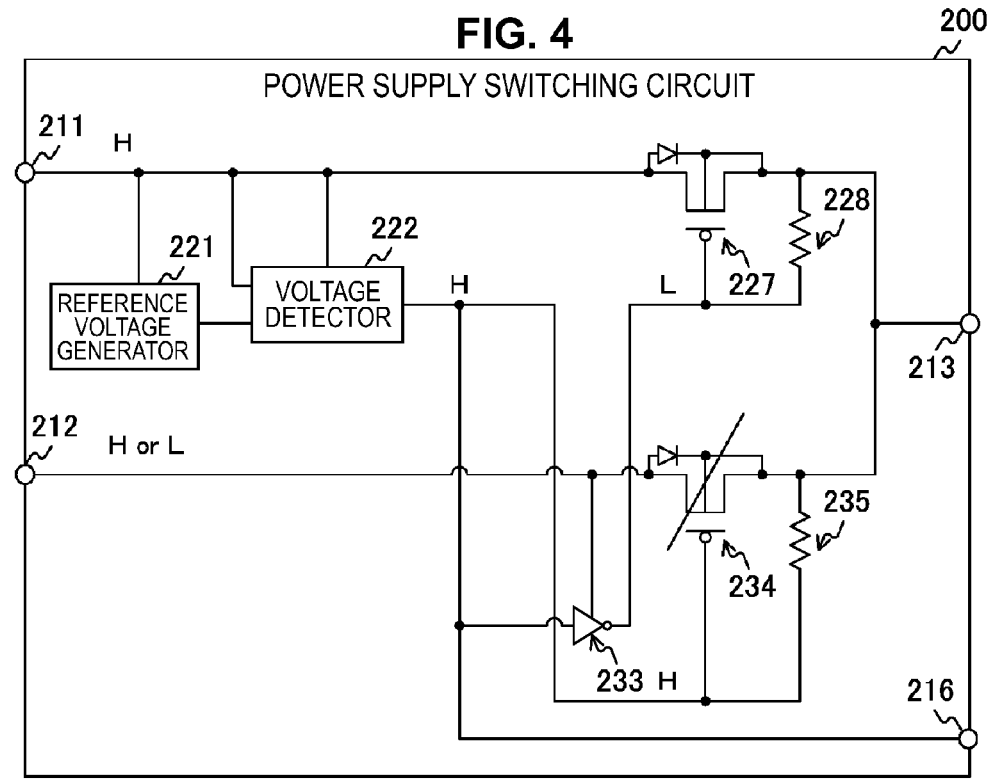
FIG. 4 is a diagram illustrating an operation of the power supply switching circuit according to the first embodiment.
Figure 4:
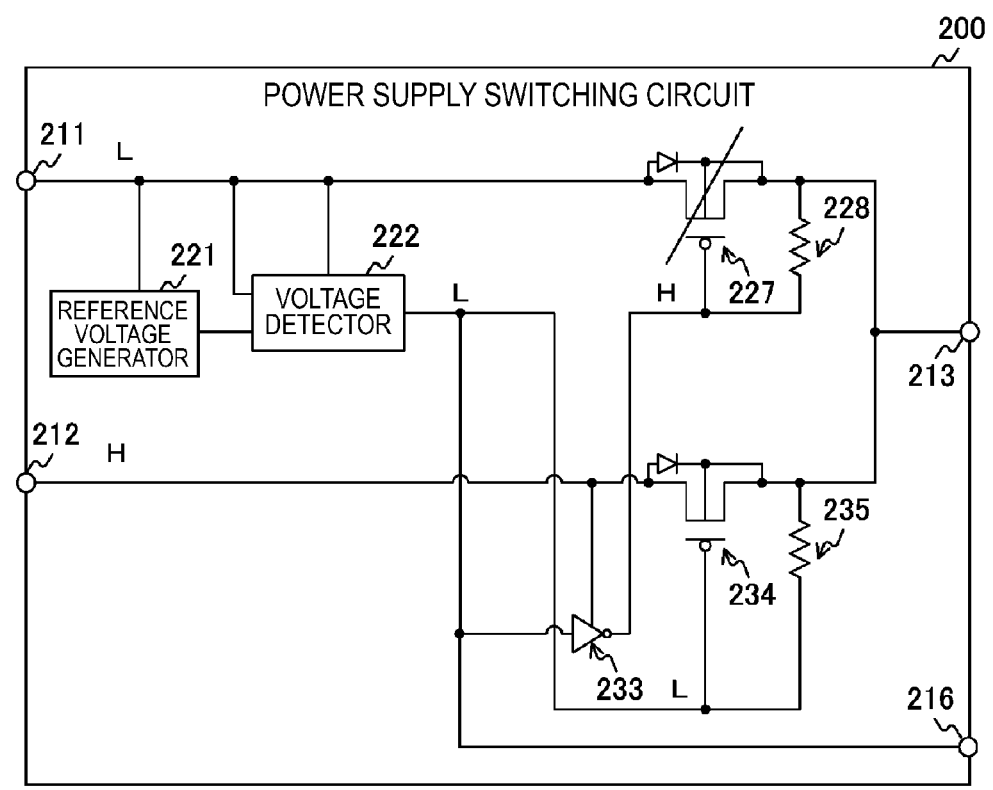

FIG. 4 is a diagram illustrating an operation of the power supply switching circuit 200 according to the first embodiment. In FIG. 4, "H" indicates that the potential is at a high level and "L" indicates that the potential is at a low level. a in FIG. 4 is a diagram illustrating an example of the operation of the power supply switching circuit 200 when the power supply voltage VDD is higher than the reference voltage Vref.

When the power supply voltage VDD is higher than the reference voltage Vref, the voltage detector 222 outputs a high-level detection signal DET and the inverter 233 inverts the detection signal DET to output a low-level inverted signal INV. The main power supply side control transistor 227 shifts to an on state due to the low-level inverted signal INV to output the main power supply MAIN and the standby power supply side control transistor 234 shifts to an off state due to the high-level detection signal DET to shut off the standby power supply BAT. Accordingly, only the main power supply MAIN is supplied to the load 140.

Because the voltage detector 222 outputs the high-level detection signal DET by using only the main power supply MAIN as described above, the standby power supply BAT is shut off by the standby power supply side control transistor 234 regardless of the voltage of the standby power supply BAT. Therefore, when the power supply voltage VDD is higher than the reference voltage Vref, power consumption of the battery 120 is curbed.

b in FIG. 4 is a diagram illustrating an example of the operation of the power supply switching circuit 200 when the power supply voltage VDD of the main power supply MAIN is equal to the reference voltage Vref or lower and the voltage of the standby power supply BAT is relatively high.

The power supply voltage VDD is equal to the reference voltage Vref or lower in this case and thus, the voltage detector 222 outputs a low-level detection signal DET and the inverter 233 inverts the detection signal DET by using the standby power supply BAT to output a high-level inverted signal INV. The main power supply side control transistor 227 shifts to an off state due to the high-level inverted signal INV to shut off the main power supply MAIN and the standby power supply side control transistor 234 shifts to an on state due to the low-level detection signal DET to output the standby power supply BAT. Accordingly, only the standby power supply BAT is supplied to the load 140.

Because the inverter 233 outputs the high-level inverted signal INV by using only the standby power supply BAT as described above, the main power supply MAIN is appropriately shut off by the main power supply side control transistor 227 even if the voltage of the main power supply MAIN is equal to the reference voltage Vref or lower.

If the inverter 233 should be configured to output a high-level inverted signal INV by using the main power supply MAIN, the inverter 233 can no longer output a high-level inverted signal INV when the voltage of the main power supply MAIN falls to the reference voltage Vref or lower. As a result, the main power supply MAIN is not shut off and the main power supply unit 110 and the battery 120 are connected via a line of relatively low impedance. If the main power supply unit 110 and the battery 120 are connected, a backflow of current from the battery 120 to the main power supply unit 110 may occur when a potential difference between the main power supply MAIN and the standby power supply BAT.

When, as illustrated in FIG. 4, the inverter 233 uses the standby power supply BAT, by contrast, a high-level inverted signal INV can be output even if the voltage of the main power supply MAIN falls to the reference voltage Vref or lower and therefore, the main power supply MAIN is shut off and a backflow to the main power supply unit 110 is prevented.

When both voltages of the main power supply MAIN and the standby power supply BAT are relatively low, the main power supply side control transistor 227 and the standby power supply side control transistor 234 are both in an on state.

Figure 5:
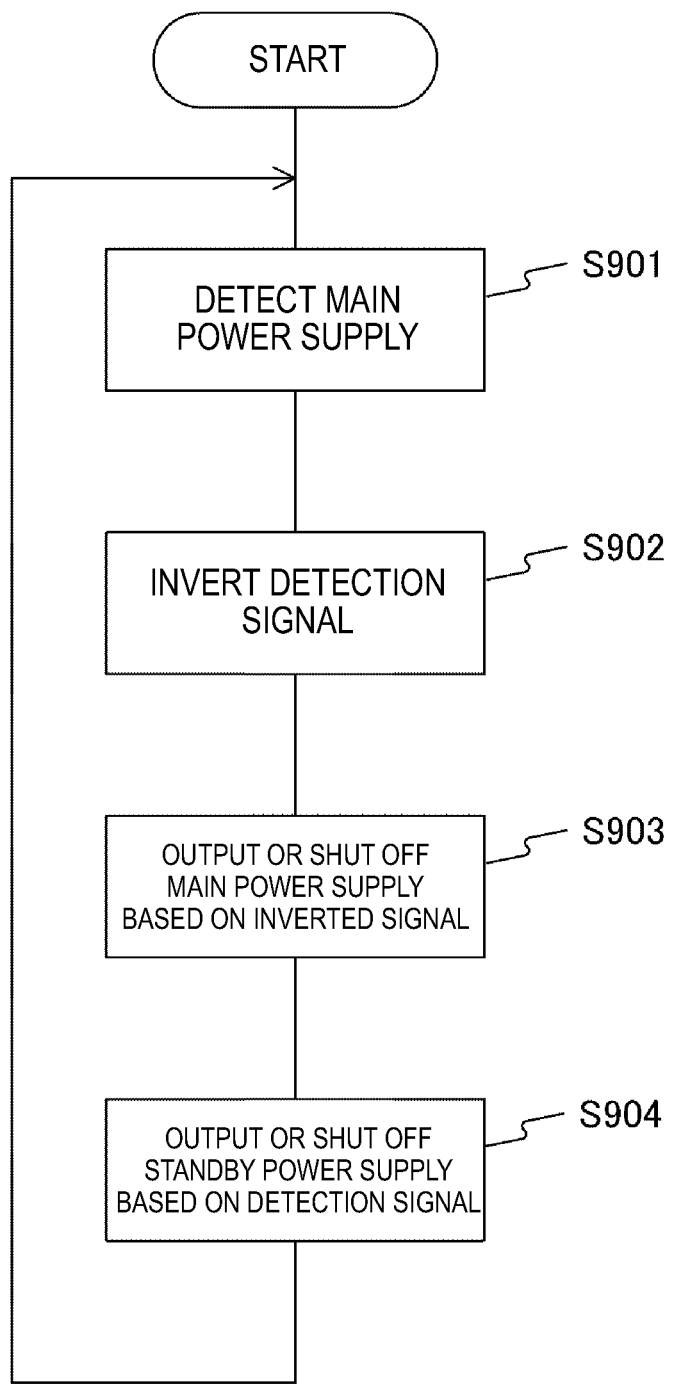
FIG. 5 is a flow chart showing an example of the operation of the electronic device according to the first embodiment.

FIG. 5 is a flow chart showing an example of the operation of the electronic device 100 according to the first embodiment. The operation is started when, for example, when power is supplied to the electronic device 100 from an external power supply or the battery 120 is provided. The voltage detector 222 in the electronic device 100 detects whether the power supply voltage VDD of the main power supply MAIN is higher than the reference voltage Vref and outputs the detection signal DET (step S901). The inverter 233 in the electronic device 100 inverts the detection signal DET (step S902).

The main power supply side control transistor 227 in the electronic device 100 outputs or shuts off the main power supply MAIN based on the inverted signal INV (step S903). The standby power supply side control transistor 234 in the electronic device 100 outputs or shuts off the standby power supply BAT based on the detection signal DET (step S904). After step S904, the electronic device 100 returns to step S901. In FIG. 5, processing of data backup after switching from the main power supply MAIN to the standby power supply BAT is omitted.

According to the first embodiment of the present technology, as described above, the voltage detector 222 outputs a high-level detection signal by using a main power supply and therefore, a standby power supply is not consumed by the voltage detector 222 and the battery 120 can be inhibited from being exhausted. In addition, when the detection signal is a low level, the inverter 233 outputs a high-level inverted signal by using the standby power supply and the main power supply side control transistor 227 shuts off the main power supply therefore, the power supply can be switched to the standby power supply even if the voltage of the main power supply is low.

[Modification]

In the first modification, a p-type MOS transistor is used to switch the power supply, but instead of the p-type MOS transistor, an n-type MOS transistor may also be used. The power supply switching circuit 200 according to a modification is different from the first embodiment in that an n-type MOS transistor is used to switch the power supply.

Figure 6:
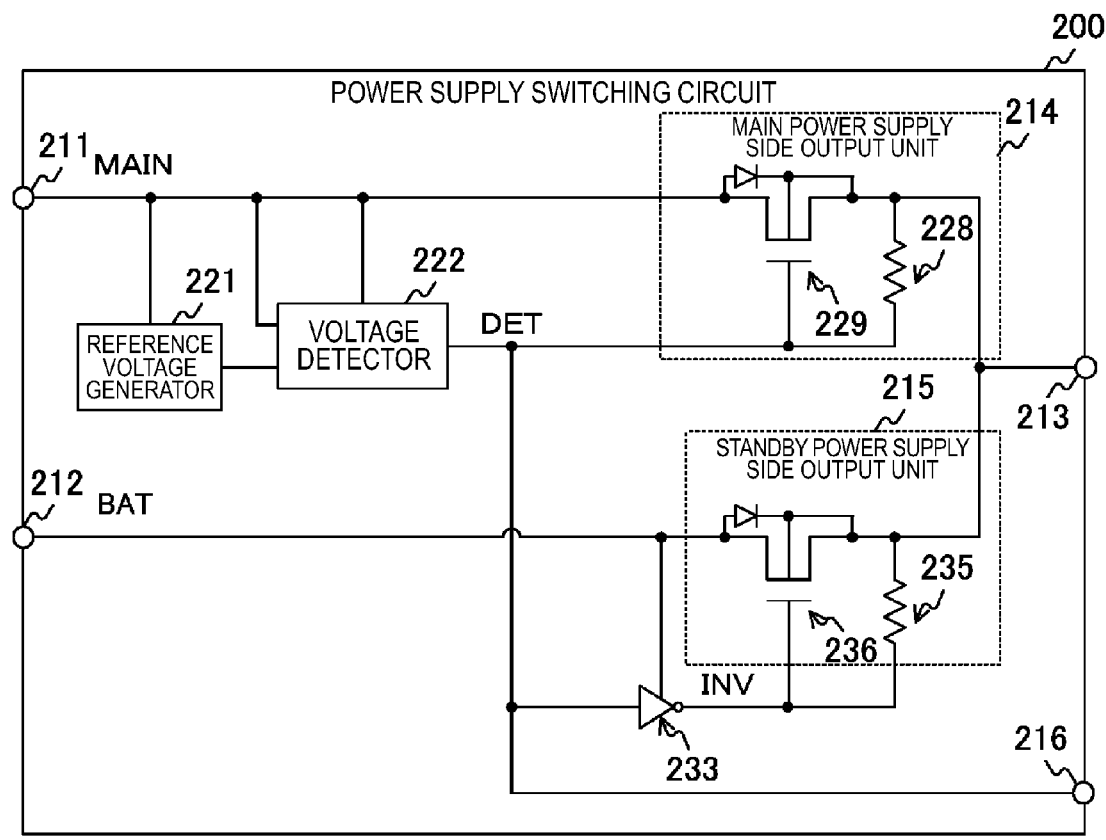
FIG. 6 is a block diagram showing a configuration example of the power supply switching circuit according to a modification of the first embodiment.

FIG. 6 is a block diagram showing a configuration example of the power supply switching circuit 200 according to a modification of the first embodiment. The power supply switching circuit 200 according to the modification is different from the first embodiment in that instead of the main power supply side control transistor 227 and the standby power supply side control transistor 234, a main power supply side control transistor 229 and a standby power supply side control transistor 236 are included.

As the main power supply side control transistor 229 and the standby power supply side control transistor 236, an n-type MOS transistor is used. In this case, the detection signal DET is input into the gate of the main power supply side control transistor 229 and the inverted signal INV is input into the gate of the standby power supply side control transistor 236.

MOS transistors are used in the power supply switching circuit 200, but any other transistor than the MOS transistor capable of outputting or shutting off the main power supply and the standby power supply may also be used. For example, instead of the MOS transistor, a bipolar transistor may be used.

According to the modification, as described above, the power supply can be switched by using an n-type MOS transistor.

2. Second Embodiment

[Configuration Example of the Power Supply Switching Circuit]

In the first embodiment, it is assumed that no current flows in the standby power supply side control transistor 234 in an off state, but depending on a potential difference between the standby power supply BAT and the main power supply MAIN, a current may flow. This is because a parasitic diode in which the drain side acts as an anode and the back gate side acts as a cathode may be formed between the drain and the back gate of the standby power supply side control transistor 234 due to the structure of a semiconductor device. If the voltage between the drain and the source is higher than a forward voltage VF of a parasitic diode, the standby power supply BAT may be output to the load 140 via the parasitic diode in the standby power supply side control transistor 234 in an off state.

If, for example, the voltage of the main power supply MAIN is 1.8 V, the voltage of the standby power supply BAT is 3.3 V, and the forward voltage VF is 0.7 V, the potential difference between the standby power supply BAT and the main power supply MAIN exceeds 0.7 V and thus, the standby power supply BAT is output from the power supply output terminal 213. The power supply switching circuit 200 in the second embodiment is different from the first embodiment in that a transistor in which a parasitic diode that suppresses the current in a direction opposite to the direction in which a parasitic diode of the standby power supply side control transistor 234 suppresses the current is formed is provided.

Figure 7:
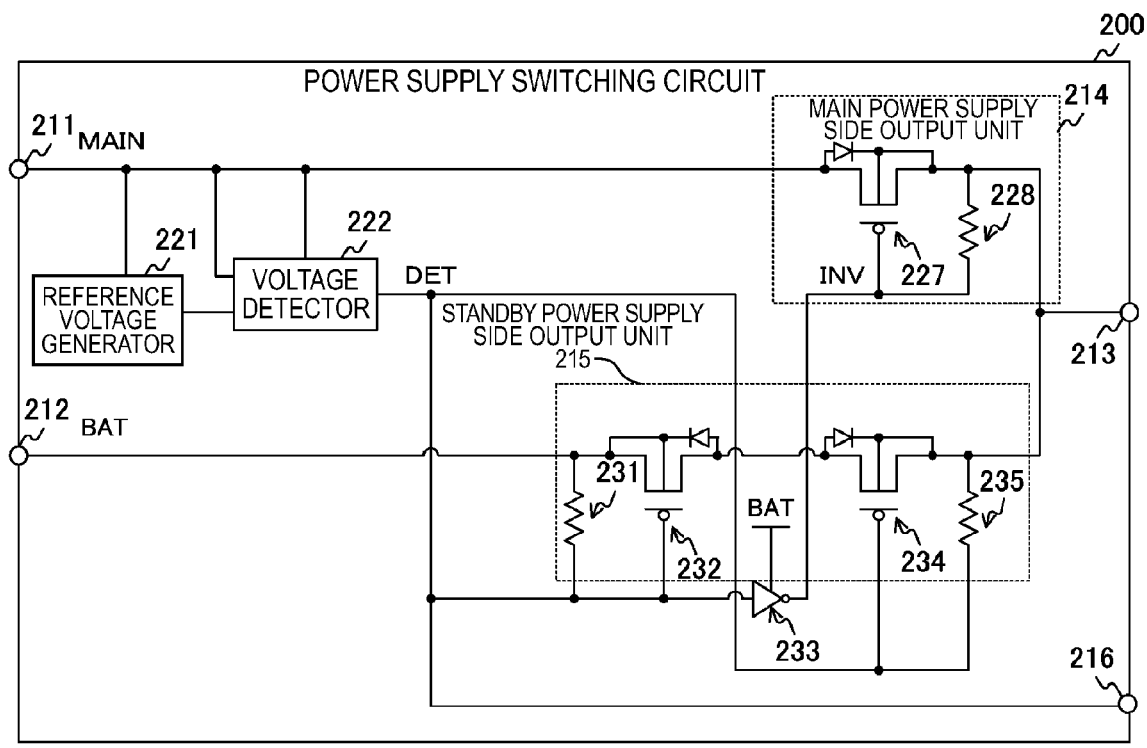
FIG. 7 is a block diagram showing a configuration example of the power supply switching circuit according to a second embodiment.

FIG. 7 is a block diagram showing a configuration example of the power supply switching circuit 200 according to the second embodiment. The power supply switching circuit 200 according to the second embodiment is different from the first embodiment in that a resistor 231 and a standby power supply side rectifier transistor 232 are provided in the standby power supply side output unit 215.

The standby power supply side rectifier transistor 232 is a transistor in which a parasitic diode in which the drain side acts as an anode and the back gate side acts as a cathode is formed between the drain and the back gate. The source of the standby power supply side rectifier transistor 232 is connected to the standby power supply side input terminal 212, the drain thereof is connected to the drain of the standby power supply side control transistor 234, and the detection signal DET is input into the gate thereof.

With the above configuration, a parasitic diode that suppresses the current in a direction opposite to the direction in which a parasitic diode of the standby power supply side control transistor 234 suppresses the current is formed in the standby power supply side rectifier transistor 232. Accordingly, even if the potential difference between the main power supply MAIN and the standby power supply BAT is higher than the forward voltage VF, a current can be prevented from flowing in the standby power supply side control transistor 234 by the parasitic diode of the standby power supply side rectifier transistor 232. As a result, exhaustion of electric power of the battery 120 is further curbed.

One end of the resistor 231 is connected to the source of the standby power supply side rectifier transistor 232 and the other end thereof is connected to the gate of the standby power supply side rectifier transistor 232. Accordingly, even if the potential (such as the ground potential VSS) of a low-level detection signal DET is a relatively high potential or the power supply of the voltage detector 222 is not sufficient and the output thereof is high impedance, the standby power supply side rectifier transistor 232 reliably shifts to an on state.

Figure 8:
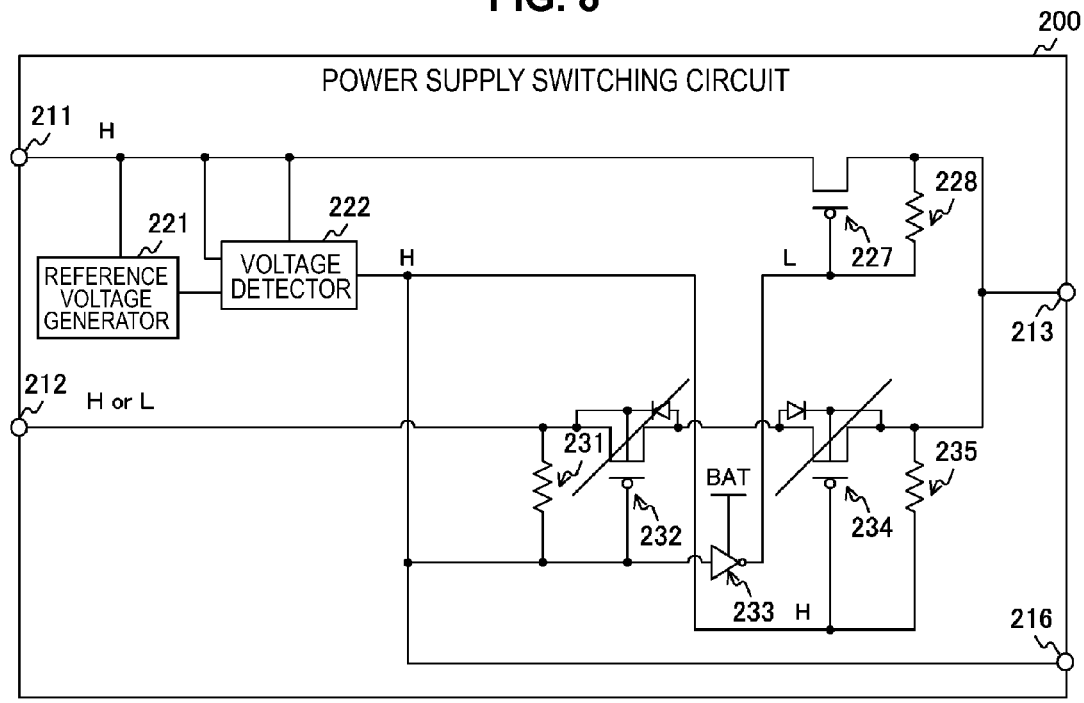
FIG. 8 is a diagram illustrating the operation of the power supply switching circuit according to the second embodiment.
Figure 8:
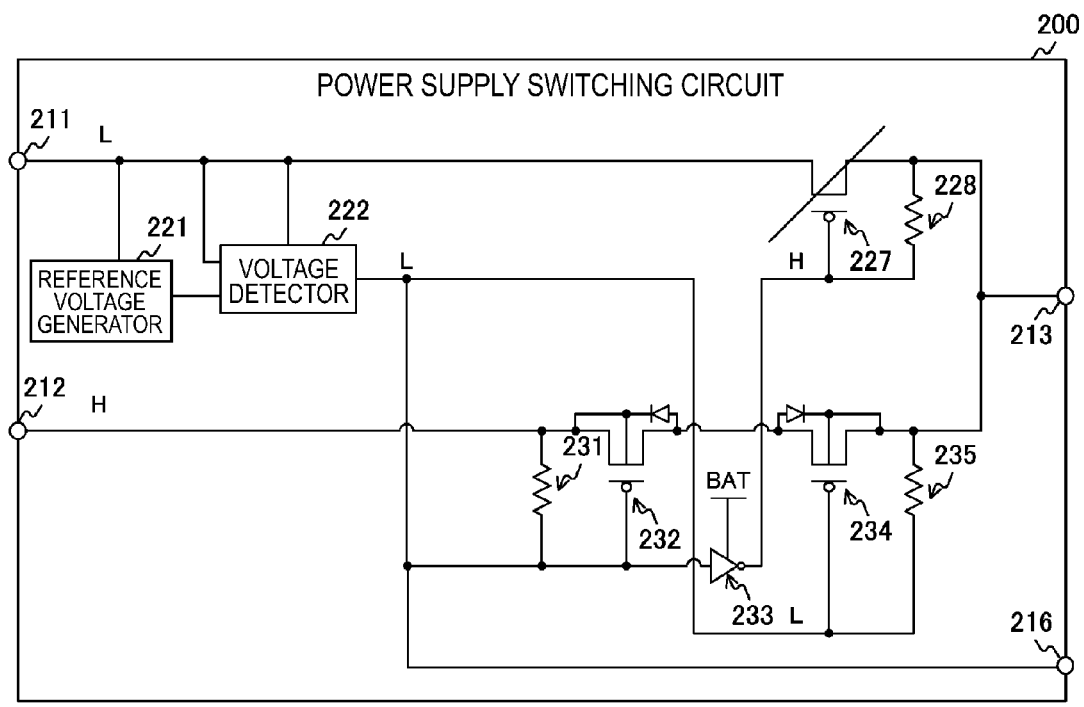

FIG. 8 is a diagram illustrating the operation of the power supply switching circuit according to the second embodiment. In FIG. 8, "H" indicates that the potential is at a high level and "L" indicates that the potential is at a low level. a in FIG. 8 is a diagram illustrating an example of the operation of the power supply switching circuit 200 when the power supply voltage VDD is higher than the reference voltage Vref.

When the power supply voltage VDD is higher than the reference voltage Vref, the voltage detector 222 outputs a high-level detection signal DET and the standby power supply side rectifier transistor 232 shifts to an off state. The rectifying direction of a parasitic diode of the standby power supply side rectifier transistor 232 is opposite to the rectifying direction of a parasitic diode of the standby power supply side control transistor 234 and therefore, there is no possibility of the standby power supply being output to the output terminal 213.

b in FIG. 8 is a diagram illustrating an example of the operation of the power supply switching circuit 200 when the power supply voltage VDD of the main power supply MAIN is equal to the reference voltage Vref or lower and the voltage of the standby power supply BAT is relatively high. In this case, the voltage detector 222 outputs a low-level detection signal DET and the standby power supply side rectifier transistor 232 shifts to an on state.

According to the second embodiment of the present technology, as described above, a transistor in which a parasitic diode whose rectifying direction is opposite to the rectifying direction of a parasitic diode of a standby power supply side control transistor is provided and therefore, a current can be prevented from flowing in the standby power supply side control transistor in an off state. Accordingly, exhaustion of the battery 120 can further be curbed. In addition, the main power supply MAIN and the standby power supply BAT are connected by low impedance and therefore, unintended charging of a power supply, for example, a case of over-charging of a power supply can be prevented.

3. Third Embodiment

[Configuration Example of the Power Supply Switching Circuit]

In the first embodiment, it is assumed that no current flows in the main power supply side control transistor 227 in an off state, but depending on a potential difference between the standby power supply BAT and the main power supply MAIN, a current may flow. This is because a parasitic diode in which the drain side acts as an anode and the back gate side acts as a cathode may be formed between the drain and the back gate of the main power supply side control transistor 227 due to the structure of a semiconductor device. The power supply switching circuit 200 in the third embodiment is different from the first embodiment in that a transistor in which a parasitic diode that suppresses the current in a direction opposite to the direction in which a parasitic diode of the main power supply side control transistor 227 suppresses the current is formed is provided.

Figure 9:
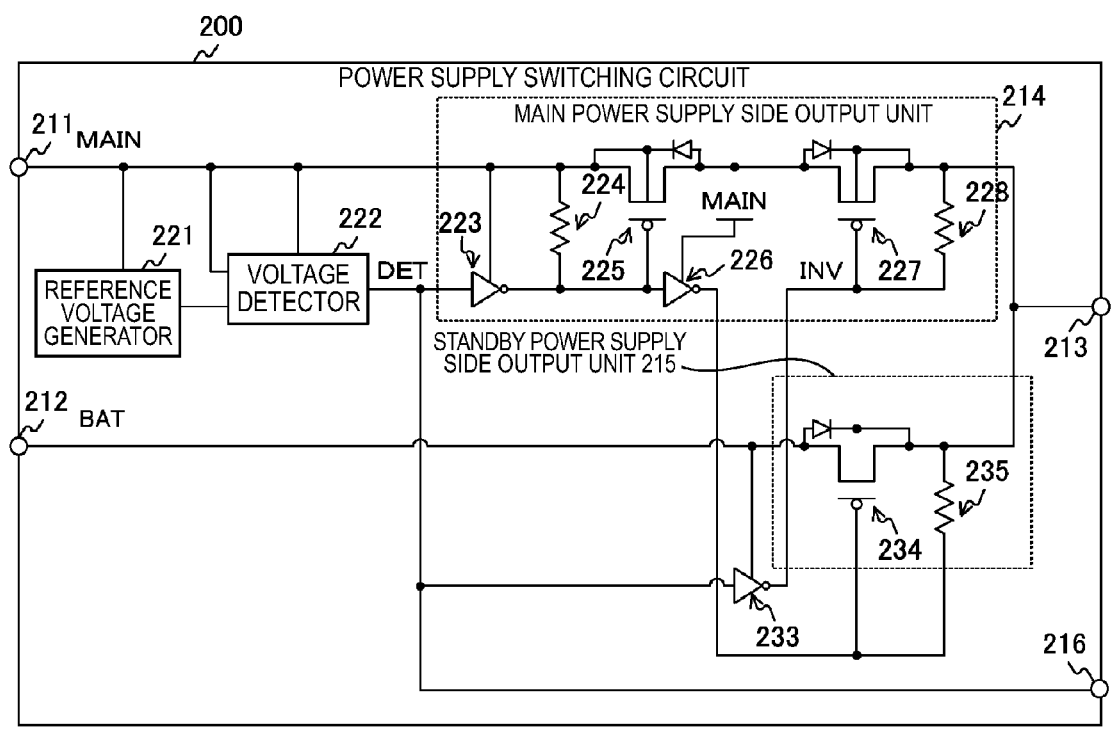
FIG. 9 is a block diagram showing a configuration example of the power supply switching circuit according to a third embodiment.

FIG. 9 is a block diagram showing a configuration example of the power supply switching circuit 200 according to the third embodiment. The power supply switching circuit 200 according to the third embodiment is different from the first embodiment in that an inverter 223, a resistor 224, a main power supply side rectifier transistor 225, and an inverter 226 are further provided in the main power supply side output unit 214.

The inverter 223 inverts the detection signal DET by using the main power supply MAIN and outputs the inverted signal to the main power supply side rectifier transistor 225 and the inverter 226 as the inverted signal INV.

The main power supply side rectifier transistor 225 is a transistor in which a parasitic diode in which the drain side acts as an anode and the back gate side acts as a cathode is formed between the drain and the back gate. The source of the main power supply side rectifier transistor 225 is connected to the main power supply side input terminal 211, the drain thereof is connected to the drain of the main power supply side control transistor 227, and the inverted signal INV is input into the gate thereof.

With the above configuration, a parasitic diode that suppresses the current in a direction opposite to the direction in which a parasitic diode of the main power supply side control transistor 227 suppresses the current is formed in the main power supply side rectifier transistor 225. Accordingly, even if the potential difference between the main power supply MAIN and the standby power supply BAT is higher than the forward voltage VF, a current can be prevented from flowing in the main power supply side control transistor 227. Accordingly, there is no possibility of malfunctions of the load 140 when the power supply is switched.

One end of the resistor 224 is connected to the source of the main power supply side rectifier transistor 225 and the other end thereof is connected to the gate of the main power supply side rectifier transistor 225. Accordingly, even if the potential (such as the ground potential VSS) of a low-level inverted signal INV is a relatively high potential or the power supply of the voltage detector 222 is not sufficient and the output thereof is a high impedance, the main power supply side rectifier transistor 225 reliably shifts to an on state.

The inverter 226 inverts the inverted signal INV by using the main power supply MAIN and outputs the inverted signal to the standby power supply side control transistor 234 as the detection signal DET.

Figure 10:
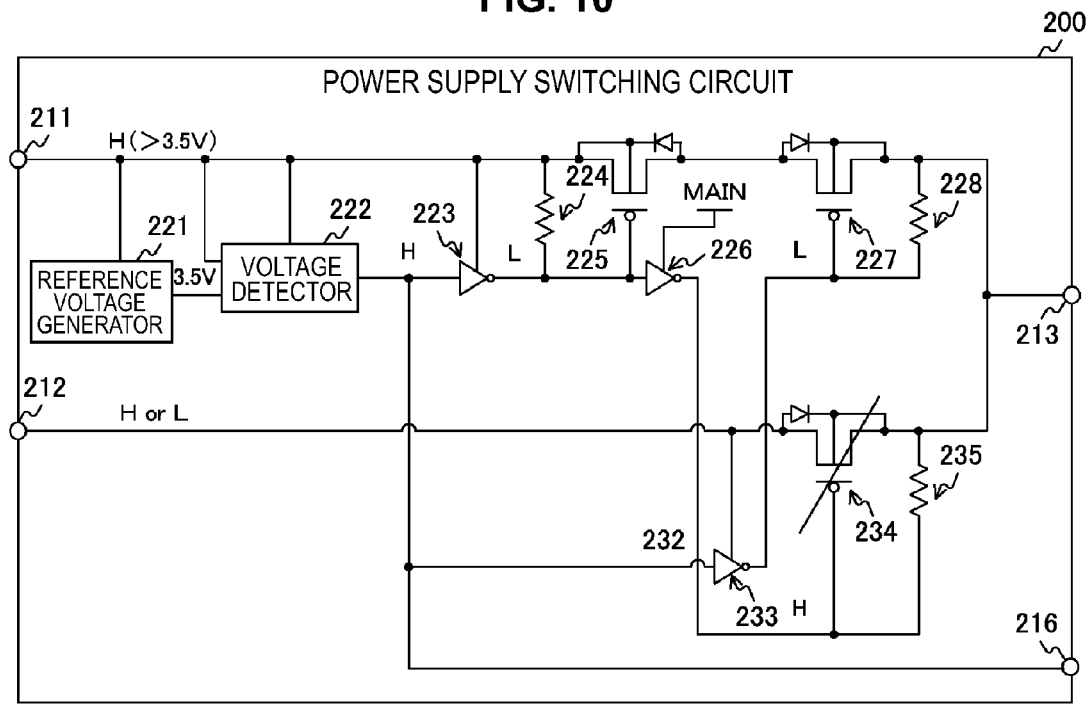
FIG. 10 is a diagram illustrating the operation of the power supply switching circuit according to the third embodiment.
Figure 10:
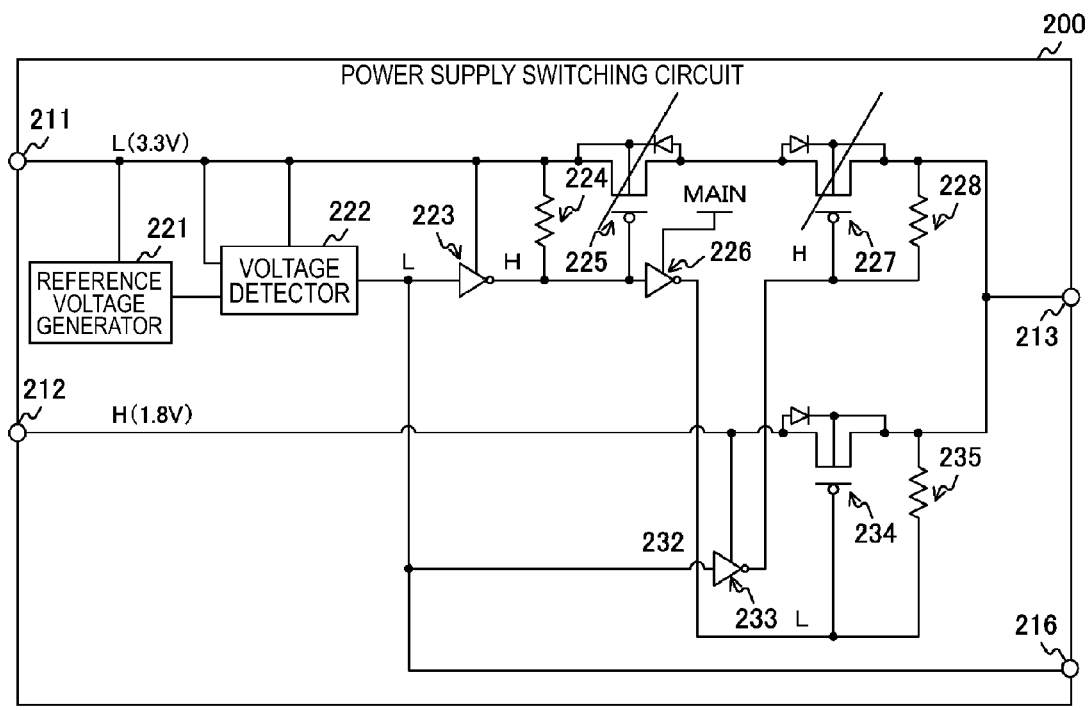

FIG. 10 is a diagram illustrating the operation of the power supply switching circuit according to the third embodiment. In FIG. 10, "H" indicates that the potential is at a high level and "L" indicates that the potential is at a low level. a in FIG. 10 is a diagram illustrating an example of the operation of the power supply switching circuit 200 when the power supply voltage VDD is higher than the reference voltage Vref.

When the power supply voltage VDD is higher than the reference voltage Vref, the inverter 223 outputs a low-level inverted signal INV and the main power supply side rectifier transistor 225 shifts to an on state.

b in FIG. 10 is a diagram illustrating an example of the operation of the power supply switching circuit 200 when the power supply voltage VDD of the main power supply MAIN is equal to the reference voltage Vref or lower and the voltage of the standby power supply BAT is relatively high. In this case, the inverter 223 outputs a high-level inverted signal INV and the main power supply side rectifier transistor 225 shifts to an off state. The inverter 233 outputs a high-level inverted signal INV and the main power supply side control transistor 227 also shifts to an off state. The rectifying direction of a parasitic diode of the main power supply side rectifier transistor 225 is opposite to the rectifying direction of a parasitic diode of the main power supply side control transistor 227 and therefore, there is no possibility of the main power supply being output to the output terminal 213.

According to the third embodiment of the present technology, as described above, a transistor in which a parasitic diode whose rectifying direction is opposite to the rectifying direction of a parasitic diode of a main power supply side control transistor is provided and therefore, a current can be prevented from flowing in the main power supply side control transistor in an off state. Accordingly, there is no possibility of malfunctions of the load 140 when the power supply is switched. In addition, the main power supply MAIN and the standby power supply BAT are connected by low impedance and therefore, unintended charging of a power supply, for example, a case of over-charging of a power supply can be prevented.

4. Fourth Embodiment

[Configuration Example of the Power Supply Switching Circuit]

In the second and third embodiments, only one of the main power supply side rectifier transistor 225 and the standby power supply side rectifier transistor 232 is configured to be provided, but both of these may also be provided.

Figure 11:
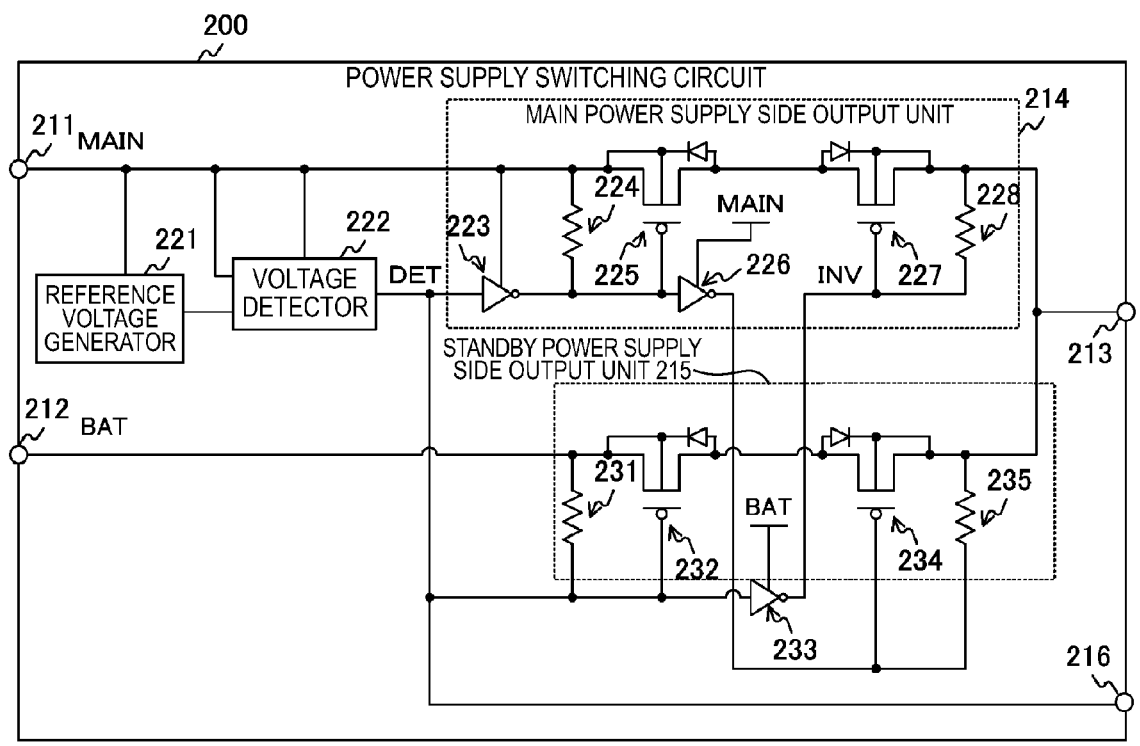
FIG. 11 is a block diagram showing a configuration example of the power supply switching circuit according to a fourth embodiment.

FIG. 11 is a block diagram showing a configuration example of the power supply switching circuit 200 according to the fourth embodiment. The power supply switching circuit 200 according to the fourth embodiment is different from the second and third embodiments in that both of the main power supply side rectifier transistor 225 and the standby power supply side rectifier transistor 232 are included.

According to the fourth embodiment of the present technology, as described above, the main power supply side rectifier transistor 225 and the standby power supply side rectifier transistor 232 are included and therefore, a current can be prevented from flowing in a main power supply side control transistor and a standby power supply side control transistor in an off state. Accordingly, exhaustion of the battery 120 can further be curbed and also the load 140 can be prevented from malfunctioning when the power supply is switched. In addition, the main power supply MAIN and the standby power supply BAT are connected by low impedance and therefore, unintended charging of a power supply, for example, a case of over-charging of a power supply can be prevented.

5. Fifth Embodiment

[Configuration Example of the Power Supply Switching Circuit]

In the fourth embodiment, it is assumed that both of the main power supply side control transistor 227 and the standby power supply side control transistor 234 are not in an on state simultaneously, but both of these transistors may be in an on state simultaneously. For example, the inverted signal INV is delayed with respect to the detection signal DET for a portion of the inverter 233 and during the delayed time, both of the main power supply side control transistor 227 and the standby power supply side control transistor 234 are in an on state. During the time, there is the possibility of a backflow of a current from one power supply to the other if the potential difference between the main power supply MAIN and the standby power supply BAT is large.

The power supply switching circuit 200 in the fifth embodiment is different from the fourth embodiment in that the detection signal DET is delayed such that both of the main power supply side control transistor 227 and the standby power supply side control transistor 234 are not in an on state simultaneously.

Figure 12:
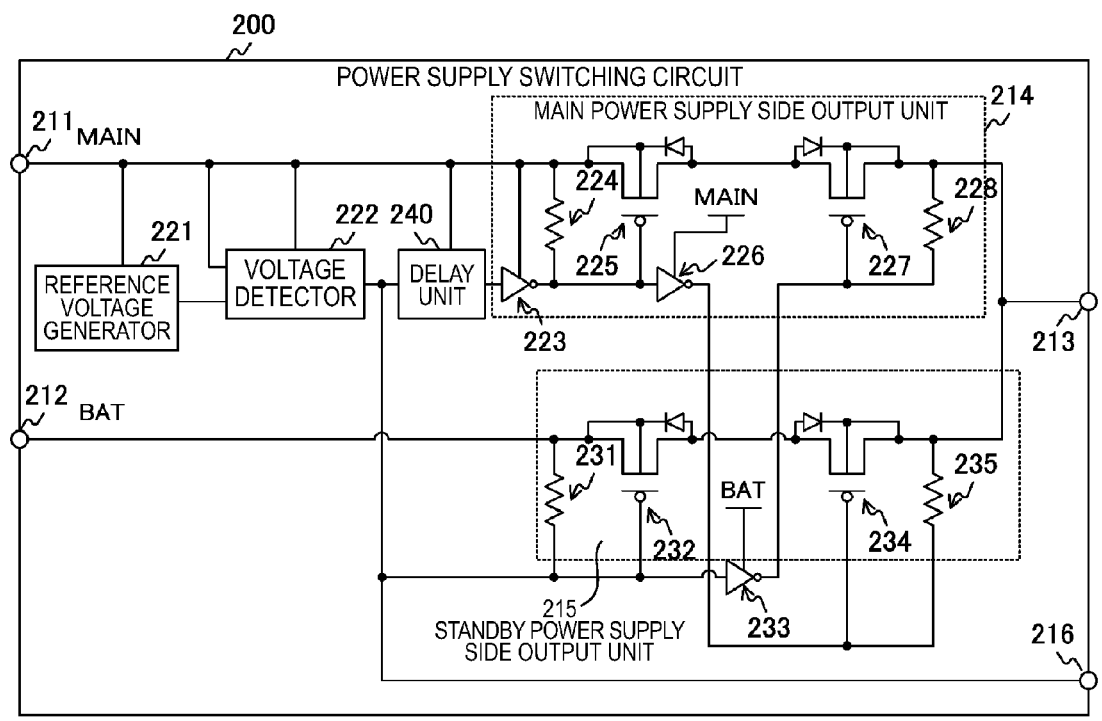
FIG. 12 is a block diagram showing a configuration example of the power supply switching circuit according to a fifth embodiment.

FIG. 12 is a block diagram showing a configuration example of the power supply switching circuit 200 according to the fifth embodiment. The power supply switching circuit 200 according to the fifth embodiment is different from the fourth embodiment in that a delay unit 240 is further included.

The delay unit 240 delays the detection signal DET with respect to the inverted signal INV by using the main power supply MAIN. The delay unit 240 outputs the delayed detection signal DET to the inverter 223.

Figure 13:
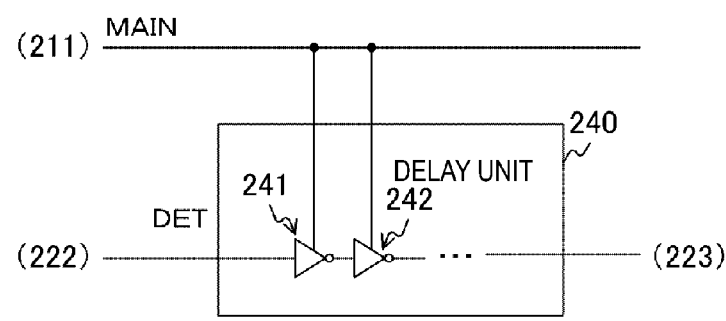
FIG. 13 is a block diagram showing a configuration example of a delay unit according to the fifth embodiment.

FIG. 13 is a block diagram showing a configuration example of the delay unit 240 according to the fifth embodiment. The delay unit 240 includes an even number of inverters such as inverters 241, 242. These inverters are connected in series between the voltage detector 222 and the inverter 223.

The delay unit 240 is configured to delay the detection signal DET by an even number of inverters, but the present embodiment is not limited to this configuration if the detection signal DET is delayed. For example, the delay unit 240 may include one or more buffers connected in series so that the detection signal DET is delayed by these buffers.

Figure 14:
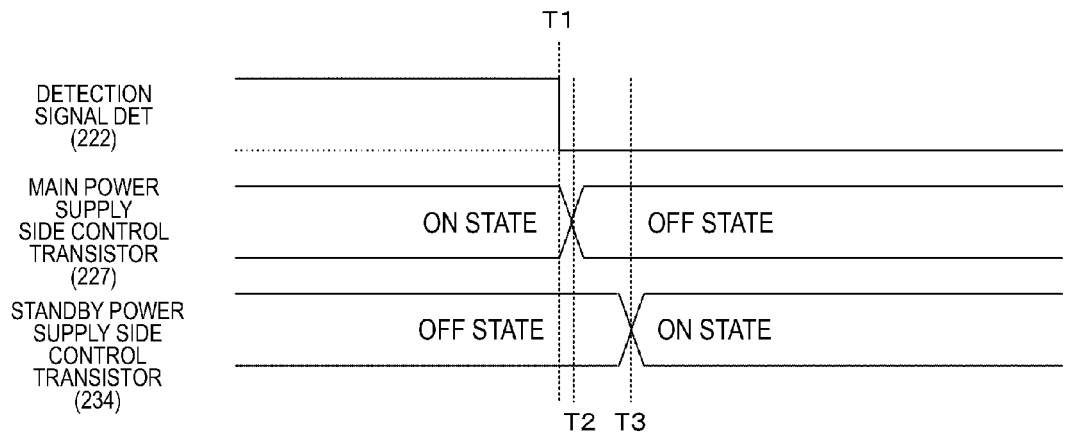
FIG. 14 is a timing chart showing an example of the operation of the power supply switching circuit according to the fifth embodiment.

FIG. 14 is a timing chart showing an example of the operation of the power supply switching circuit 200 according to the fifth embodiment. It is assumed that the voltage detector 222 outputs a low-level detection signal DET at time T1. At time T2 after time T1, the main power supply side control transistor 227 shifts from an on state to an off state due to a high-level inverted signal INV. Then, at time T3 when a delayed time by the delay unit 240 and the inverters 223, 226 passes from time T1, the standby power supply side control transistor 234 shifts from an off state to an on state due to a low-level detection signal DET.

Because the time when the standby power supply side control transistor 234 shifts to an on state is delayed due to the delay of the detection signal DET, both of the main power supply side control transistor 227 and the standby power supply side control transistor 234 are in an off state between time T2 and time T3. Accordingly, a backflow from one of the main power supply MAIN and the standby power supply BAT to the other is prevented.

According to the fifth embodiment, as described above, the detection signal DET is delayed with respect to the inverted signal INV and thus, both of the main power supply side control transistor 227 and the standby power supply side control transistor 234 are in an off state in the delayed time. Accordingly, a backflow from one of the main power supply MAIN and the standby power supply BAT to the other is prevented.

[Modification]

The detection signal DET is delayed in the fifth embodiment, but instead of the detection signal DET, the inverted signal INV may be delayed. When the potential difference between the main power supply MAIN and the standby power supply BAT is not so large during switching or a backflow prevention circuit is provided, there is no possibility of a backflow even if both of the main power supply side control transistor and the standby power supply side control transistor are in an on state. If a period in which both of the main power supply side control transistor 227 and the standby power supply side control transistor 234 are in an on state is long, the capacity of the capacitor 130 can be reduced for the period. The power supply switching circuit 200 according to a modification of the fifth embodiment is different from the fifth embodiment in that instead of the detection signal DET, the inverted signal INV is delayed.

Figure 15:
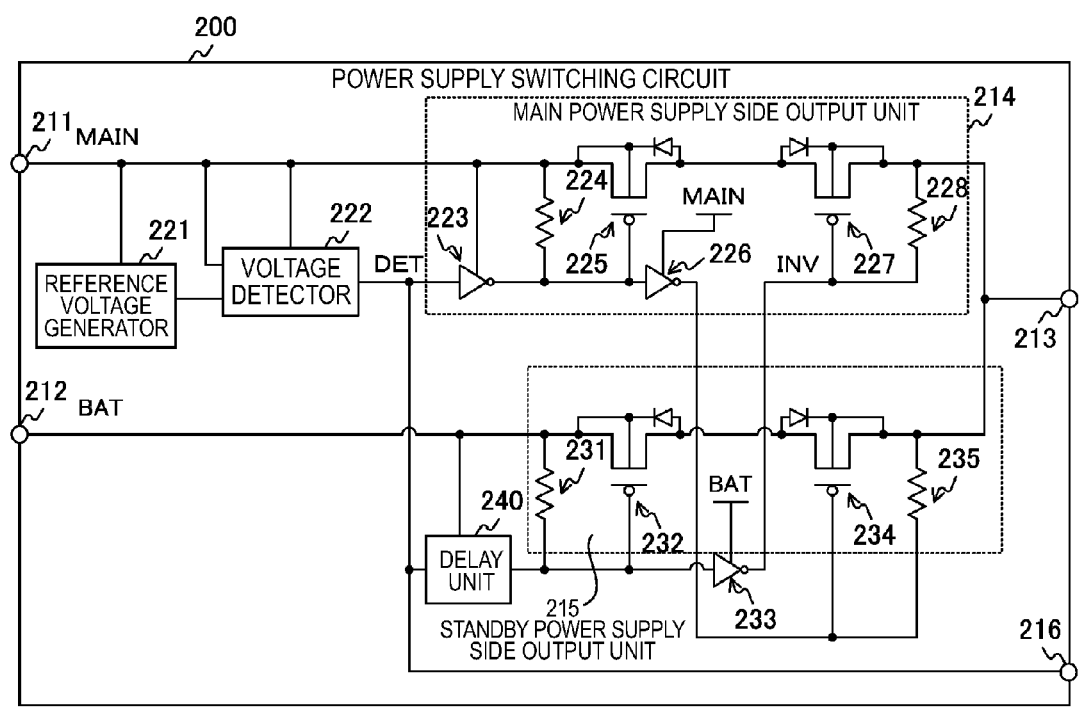
FIG. 15 is a block diagram showing a configuration example of the power supply switching circuit according to a modification of the fifth embodiment.

FIG. 15 is a block diagram showing a configuration example of the power supply switching circuit 200 according to a modification of the fifth embodiment. The power supply switching circuit 200 according to the fifth embodiment is different from the fourth embodiment in that the delay unit 240 is inserted between the voltage detector 222 and the inverter 233 and the standby power supply BAT is used. With this configuration, the inverted signal INV is delayed.

Figure 16:
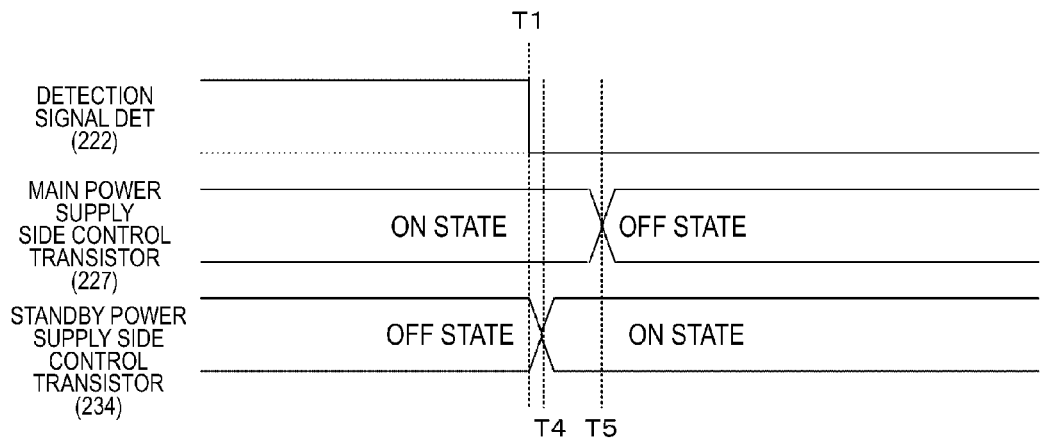
FIG. 16 is a timing chart showing an example of the operation of the power supply switching circuit according to the modification of the fifth embodiment.

FIG. 16 is a timing chart showing an example of the operation of the power supply switching circuit 200 according to the modification of the fifth embodiment. It is assumed that the voltage detector 222 outputs a low-level detection signal DET at time T1. At time T4 after time T1, the standby power supply side control transistor 234 shifts from an off state to an on state due to a low-level detection signal DET. Then, at time T5 when a delayed time by the delay unit 240 and the inverter 233 passes from time T1, the main power supply side control transistor 227 shifts from an on state to an off state due to a high-level inverted signal INV.

Because the time when the main power supply side control transistor 227 shifts to an off state is delayed due to the delay of the inverted signal INV, both of the main power supply side control transistor 227 and the standby power supply side control transistor 234 are in an on state between time T4 and time T5. Accordingly, the capacity of the capacitor 130 can be reduced.

According to the modification of the fifth embodiment, as described above, the inverted signal INV is delayed more than the detection signal DET and thus, both of the main power supply side control transistor 227 and the standby power supply side control transistor 234 are in an on state in the delayed time. Accordingly, the capacity of the capacitor 130 can be reduced.

6. Sixth Embodiment

[Configuration Example of the Power Supply Switching Circuit]

A signal is delayed by an inverter in the fifth embodiment, but a signal may also be delayed by an RC circuit including a capacitor and impedance. The power supply switching circuit 200 according to the sixth embodiment is different from the fifth embodiment in that a signal is delayed by an RC circuit.

Figure 17:
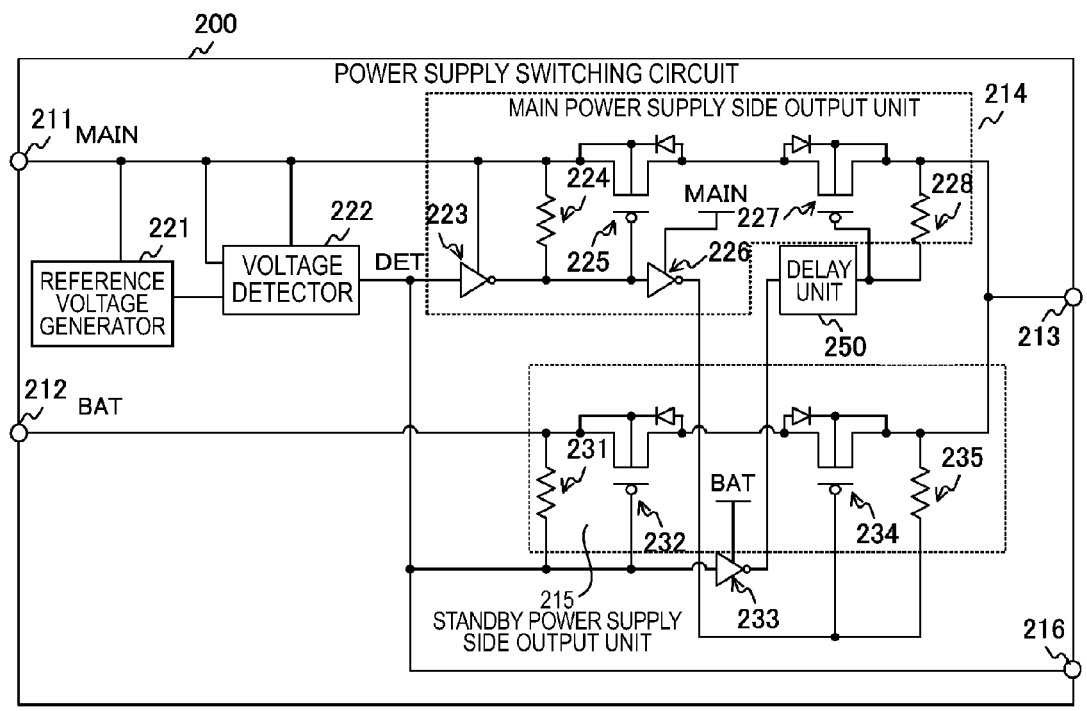
FIG. 17 is a block diagram showing a configuration example of the power supply switching circuit according to a modification of a sixth embodiment.

FIG. 17 is a block diagram showing a configuration example of the power supply switching circuit 200 according to a modification of the sixth embodiment. The power supply switching circuit 200 according to the sixth embodiment is different from the fifth embodiment in that instead of the delay unit 240, a delay unit 250 is included. The delay unit 250 delays the inverted signal INV by an RC circuit.

Figure 18:
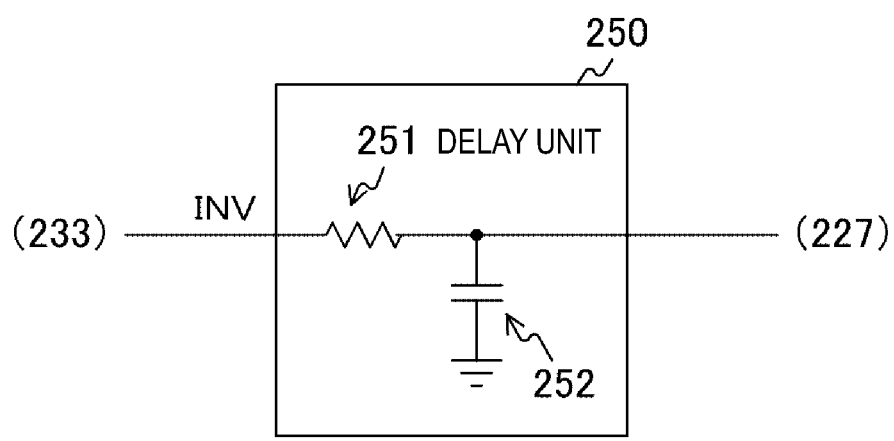
FIG. 18 is a block diagram showing a configuration example of the delay unit according to the sixth embodiment.

FIG. 18 is a block diagram showing a configuration example of the delay unit 250 according to the sixth embodiment. The delay unit 250 includes a resistor 251 and a capacitor 252. One end of the resistor 251 is connected to the inverter 233 and the other end thereof is connected to the capacitor 252 and the main power supply side control transistor 227. One end of the capacitor 252 is connected to the resistor 251 and the main power supply side control transistor 227 and the ground potential VSS is applied to the other end thereof.

Due to the RC circuit including the resistor 251 and the capacitor 252, the potential of the inverted signal INV gradually changes over time. For example, an output voltage Vc of the delay unit 250 is represented by the following formula. The unit of Vc is, for example, the volt (V).

$$Vc=V_{in}(1-e^{(-t/Rc)})$$  Formula 1

In the above formula, $V_{in}$ is an input voltage of the delay unit 250 and the unit thereof is, for example, the volt (V). t is an elapsed time from the time when $V_{in}$ changes and the unit thereof is, for example, the second (s). R is the resistance value of the resistor 251 and the unit thereof is, for example, the ohm ($\Omega$). C is the capacity of the capacitor 252 and the unit thereof is, for example, the farad (F). Because, as illustrated in Formula 1, the potential gradually changes and thus, rapid fluctuations of the potential can be suppressed. In addition, the capacity of the capacitor 130 outside the power supply switching circuit 200 can be reduced.

The delay unit 250 delays the inverted signal INV, but may also delay, instead of the inverted signal INV, the detection signal DET. Alternatively, the delay unit 250 may delay both of the inverted signal INV and the detection signal DET.

According to the modification of the sixth embodiment, as described above, a signal is delayed by an RC circuit and therefore, rapid fluctuations in voltage can be suppressed.

The above-described embodiments are examples for embodying the present technology, and matters in the embodiments each have a corresponding relationship with subject matters in the claims. Likewise, the matters in the embodiments and the subject matters in the claims denoted by the same names have a corresponding relationship with each other. However, the present technology is not limited to the embodiments, and various modifications of the embodiments may be embodied in the scope of the present technology without departing from the spirit of the present technology.

In addition, the process procedures in the above-described embodiments may be grasped as a method including the series of procedures, and may be grasped as a program for enabling a computer to execute the series of procedures or a recording medium storing the program thereon. The recording medium may use, for example, a CD (Compact Disc), an MD (Mini Disc), a DVD (Digital Versatile Disk), a memory card, a Blu-ray Disc (registered trademark), or the like.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1) A power supply switching circuit including:
a first control signal output unit that outputs a signal exceeding a predetermined potential using a main power supply as a first control signal when a power supply voltage of the main power supply exceeds a predetermined reference voltage;
a second control signal output unit that outputs the signal exceeding the predetermined potential using a standby power supply from a battery as a second control signal when a potential of the first control signal does not exceed the predetermined potential; and
a power supply output unit that outputs the main power supply when the first control signal exceeds the predetermined potential and outputs the standby power supply when the second control signal exceeds the predetermined potential.

(2) The power supply switching circuit according to (1), wherein the power supply output unit includes
a main power supply side output unit that outputs or shuts off the main power supply depending on whether the potential of a main power supply side control signal, which is one of the first and second control signals, exceeds the predetermined potential, and
a standby power supply side output unit that outputs or shuts off the standby power supply depending on whether the potential of a standby power supply side control signal, which is the other of the first and second control signals, exceeds the predetermined potential.

(3) The power supply switching circuit according to (2), wherein the standby power supply side output unit includes
a standby power supply side control transistor that outputs or shuts off the standby power supply depending on whether the potential of the standby power supply side control signal exceeds the predetermined potential after a first standby power supply side parasitic diode being formed, and
a standby power supply side rectifier transistor in which a second standby power supply side parasitic diode that suppresses a current in a direction opposite to the direction in which the first standby power supply side parasitic diode suppresses the current is formed.

(4) The power supply switching circuit according to (2) or (3),
wherein the main power supply side output unit includes
a main power supply side control transistor that outputs or shuts off the main power supply depending on whether the potential of the main power supply side control signal exceeds the predetermined potential after a first main power supply side parasitic diode being formed, and
a main power supply side rectifier transistor in which a second main power supply side parasitic diode that suppresses a current in a direction opposite to the direction in which the first main power supply side parasitic diode suppresses the current is formed.

(5) The power supply switching circuit according to any one of (1) to (4), further including:
a delay unit that delays one of the first and second control signals with respect to the other.

(6) The power supply switching circuit according to any one of (1) to (5),
wherein the first control signal output unit outputs a signal not exceeding the predetermined potential as the first control signal when the power supply voltage does not exceed the predetermined potential, and
wherein the second control signal output unit outputs the signal not exceeding the predetermined potential as the second control signal when the potential of the first control signal exceeds the predetermined potential.

(7) A power supply switching circuit including:
a voltage detector that outputs a detection signal by using a main power supply to detect the main power supply;

an inverter that inverts the detection signal output by the voltage detector by using a standby power supply from a battery and outputs the signal as an inverted signal;
a main power supply side control transistor that outputs or shuts off the main power supply based on one of the detection signal and the inverted signal; and
a standby power supply side control transistor that outputs or shuts off the standby power supply based on the other of the detection signal and the inverted signal.

(8) An electronic device including:
a main power supply unit that supplies a main power supply;
a battery that supplies a standby power supply;
a first control signal output unit that outputs a signal exceeding a predetermined potential using the main power supply as a first control signal when a power supply voltage of the main power supply exceeds a predetermined reference voltage;
a second control signal output unit that outputs the signal exceeding the predetermined potential using the standby power supply as a second control signal when a potential of the first control signal does not exceed the predetermined potential; and
a power supply output unit that outputs the main power supply when the first control signal exceeds the predetermined potential and outputs the standby power supply when the second control signal exceeds the predetermined potential.

(9) A control method of a power supply switching circuit, the method including:
outputting a signal exceeding a predetermined potential using a main power supply as a first control signal by a first control signal output unit when a power supply voltage of the main power supply exceeds a predetermined reference voltage;
outputting the signal exceeding the predetermined potential using a standby power supply from a battery as a second control signal by a second control signal output unit when a potential of the first control signal does not exceed the predetermined potential; and
outputting the main power supply when the first control signal exceeds the predetermined potential and outputting the standby power supply when the second control signal exceeds the predetermined potential by a power supply output unit.

What is claimed is:

1. A power supply switching circuit comprising:
a power supply output terminal electrically connected directly to a cathode of a main power supply side diode and a cathode of a standby power supply side diode;
power supply output circuitry configured to output a main power supply voltage onto the power supply output terminal when control signal output circuitry detects that the main power supply voltage is higher than a reference voltage.

2. The power supply switching circuit according to claim 1, wherein the reference voltage differs from the main power supply voltage.

3. The power supply switching circuit according to claim 1, wherein the control signal output circuitry includes first control signal output circuitry that is configured to output a first signal onto a gate of a standby power supply side control transistor.

4. The power supply switching circuit according to claim 3, wherein the cathode of the standby power supply side diode is electrically connected directly to a source of a standby power supply side control transistor.

5. The power supply switching circuit according to claim 3, wherein an anode of the standby power supply side diode is electrically connected directly to a drain of the standby power supply side control transistor.

6. The power supply switching circuit according to claim 3, wherein the power supply output circuitry is controllable by the first signal to output the main power supply voltage onto the power supply output terminal when the first signal is at a first logic level.

7. The power supply switching circuit according to claim 6, wherein the first control signal output circuitry is configured to output the first signal at the first logic level when the main power supply voltage is higher than the reference voltage.

8. The power supply switching circuit according to claim 6, wherein the control signal output circuitry includes second control signal output circuitry that is configured to output a second signal at the first logic level when the first signal is at a second logic level.

9. The power supply switching circuit according to claim 8, wherein the second logic level differs from the first logic level.

10. The power supply switching circuit according to claim 8, wherein the second control signal output circuitry is configured to output the second signal at the second logic level when the first signal is at the first logic level.

11. The power supply switching circuit according to claim 1, wherein the control signal output circuitry includes second control signal output circuitry that is configured to output a second signal onto a gate of a main power supply side control transistor.

12. The power supply switching circuit according to claim 11, wherein the power supply output circuitry is controllable by the second signal to output the standby power supply voltage onto the power supply output terminal when the second signal is at the first logic level.

13. The power supply switching circuit according to claim 11, wherein the power supply output circuitry is controllable by the second signal to output the main power supply voltage onto the power supply output terminal when the second signal is at the second logic level.

14. The power supply switching circuit according to claim 1, wherein the power supply output circuitry is configured to output a standby power supply voltage onto the power supply output terminal when the control signal output circuitry detects that the main power supply voltage is not higher than the reference voltage.

15. The power supply switching circuit according to claim 14, wherein the standby power supply voltage differs from the reference voltage.

16. The power supply switching circuit according to claim 14, wherein the standby power supply voltage differs from the main power supply voltage.

17. An electronic device comprising:
the power supply switching circuit according to claim 14;
main power supply output circuitry configured to supply the main power supply voltage; and
a battery configured to supply the standby power supply voltage.

18. A control method of a power supply switching circuit, the method comprising:
outputting, by a power supply output circuitry, a main power supply voltage onto a power supply output terminal when control signal output circuitry detects that the main power supply voltage is higher than a reference voltage; and outputting, by the power supply output circuitry, a standby power supply voltage onto the power supply output terminal when the control signal output circuitry detects that the main power supply voltage is not higher than the reference voltage, wherein the power supply output terminal electrically connected directly to a cathode of a main power supply side diode and a cathode of a standby power supply side diode.

\* \* \* \* \*